United States Patent [19]

Rufford

[11] Patent Number: 4,744,059

[45] Date of Patent: May 10, 1988

[54] APPARATUS AND METHOD FOR REDUCING WRITE RECOVERY TIME IN A RANDOM ACCESS MEMORY

[75] Inventor: Roger V. Rufford, Redwood City, Calif.

[73] Assignee: Fairchild Camera and Instrument Corporation, Mountain View, Calif.

[21] Appl. No.: 810,955

[22] Filed: Dec. 18, 1985

[51] Int. Cl.⁴ ............................................. G11C 7/00
[52] U.S. Cl. ..................................... 365/189; 365/230
[58] Field of Search ................................ 365/189, 230

[56] References Cited

U.S. PATENT DOCUMENTS 4,611,299 9/1986 Hori et al. ........................... 365/230

Primary Examiner—James W. Moffitt
Attorney, Agent, or Firm—Fitch, Even, Tabin & Flannery

[57] ABSTRACT

An apparatus for reducing the write recovery time of a memory during a write operation is responsive to the detection of a write enable signal for causing the data being written into a selected memory cell to be immediately coupled out on the memory's corresponding output data line independent of the speed at which the data is actually written into the memory cell. The state of a cache memory element is set to reflect this data state such that when the write enable signal goes off, the cache memory element maintains the present state of said output data line. The cache memory element is overridden as the corresponding memory cell reaches a steady state condition at the end of the write operation.

13 Claims, 6 Drawing Sheets

APPARATUS AND METHOD FOR REDUCING WRITE RECOVERY TIME IN A RANDOM ACCESS MEMORY

BACKGROUND OF THE INVENTION

The present invention is directed to random access memory devices, and more specifically to means for reducing the time it takes for data written into a memory cell to thereafter be available for read out from the memory.

In conventional memory systems, the interval of time needed to complete a write operation is determined by the time it takes for the data signal being written into the memory to propagate through the memory plus the time it takes for the memory cell or cells in which the data is being written to change state, i.e, its roll-over time. The time that a memory user must wait until this data can be accessed for read out of the data is generally termed the write recovery time of the memory (TWR). A number of procedures are known in the art for reducing both the propagation delay in the memory and the roll-over time of a memory cell. For example, the propagation delay can be reduced by minimizing lead lengths in the memory system. Memory cell switching can be speeded up by minimizing the inherent capacitances which exist in the memory cell transistors, by reducing the resistance of bias resistors in the cell, etc.

One of the tradeoffs in designing such memory cells is that to get low power, you want the bias resistors in the cell to be large. If high speed is desired, however, small resistors are needed. Combining small resistors with minimized parasitic capacitances in the transistors used in the memory cells reduces the RC time constant effects of these elements. The drawback of various process improvements which attempt to minimize parasitic and junction capacitances in a memory cell is that they tend to increase the overall cost of the memory system. What is therefore needed is a memory system that does not require unusual processing, is designed to operate at low power, and at the same time provides a memory system which has a very fast write recovery time.

This problem is more of a concern in certain of the more recent memory systems, since the memory user of such memory systems is no longer required to wait a full memory cycle time before beginning a read operation after a write operation has been completed. For many memory systems, all the memory designer needed to do was to make sure that the write recovery time was less than the time it took the user to address the same memory cell during the next read cycle. More recent users, however, have insisted on systems that give them the ability to do a read operation in the same cycle as the write operation. In these latter systems, write recovery times on the order of five to ten nanoseconds or less are required.

Consequently, an object of the present invention is to minimize the write recovery time of memory cells in a memory during a write operation so as to enable a user to perform a subsequent read operation of data written to that cell or cells as soon as possible after the data has been written. That is, the present invention is designed to substantially eliminate the memory's write recovery time, the interval that exists between the time data is presented to a memory cell, is stored in the memory cell, and thereafter propagates through the cell's sense amplifier and out to the output data lines of the memory.

SUMMARY OF THE INVENTION

The present invention creates a second data path for data being written into a memory cell in a memory array. During a write operation, a write enable control signal is coupled to the memory along with the data to be stored in a selected memory cell or cells. According to the present invention, the data word is also coupled to a fast cache apparatus positioned between the memory cell sense amplifiers and the output data lines. This apparatus immediately couples the data word being written into the memory onto the output data lines and stores the data word in a separate cache memory element or register such that when the write enable signal is removed, the cache memory element continues to enable the data word to be coupled out on the output data lines. Means are included for overriding the cache memory apparatus data word output once the selected memory cell or cells have rolled over to the new data word state and this new data word state has propagated out through the sense amplifier associated with each cell. That is, the present invention acts to immediately couple to the memory output data lines the data word being written into the memory for as long as it takes for the data word to first be stored in the conventional slower memory cells and thereafter to propagate through the memory sense amplifiers and out to the output data lines of the memory. Once this has taken place, the cache memory output is overridden by the actual memory word output and becomes transparent to later readout of the memory cells.

BRIEF DESCRIPTION OF THE DRAWINGS

Other objects and advantages of the present invention will become apparent upon reference to the following detailed description of the preferred embodiment and the attached drawings in which.

DETAILED DESCRIPTION OF A PREFERRED EMBODIMENT

Figure 1:
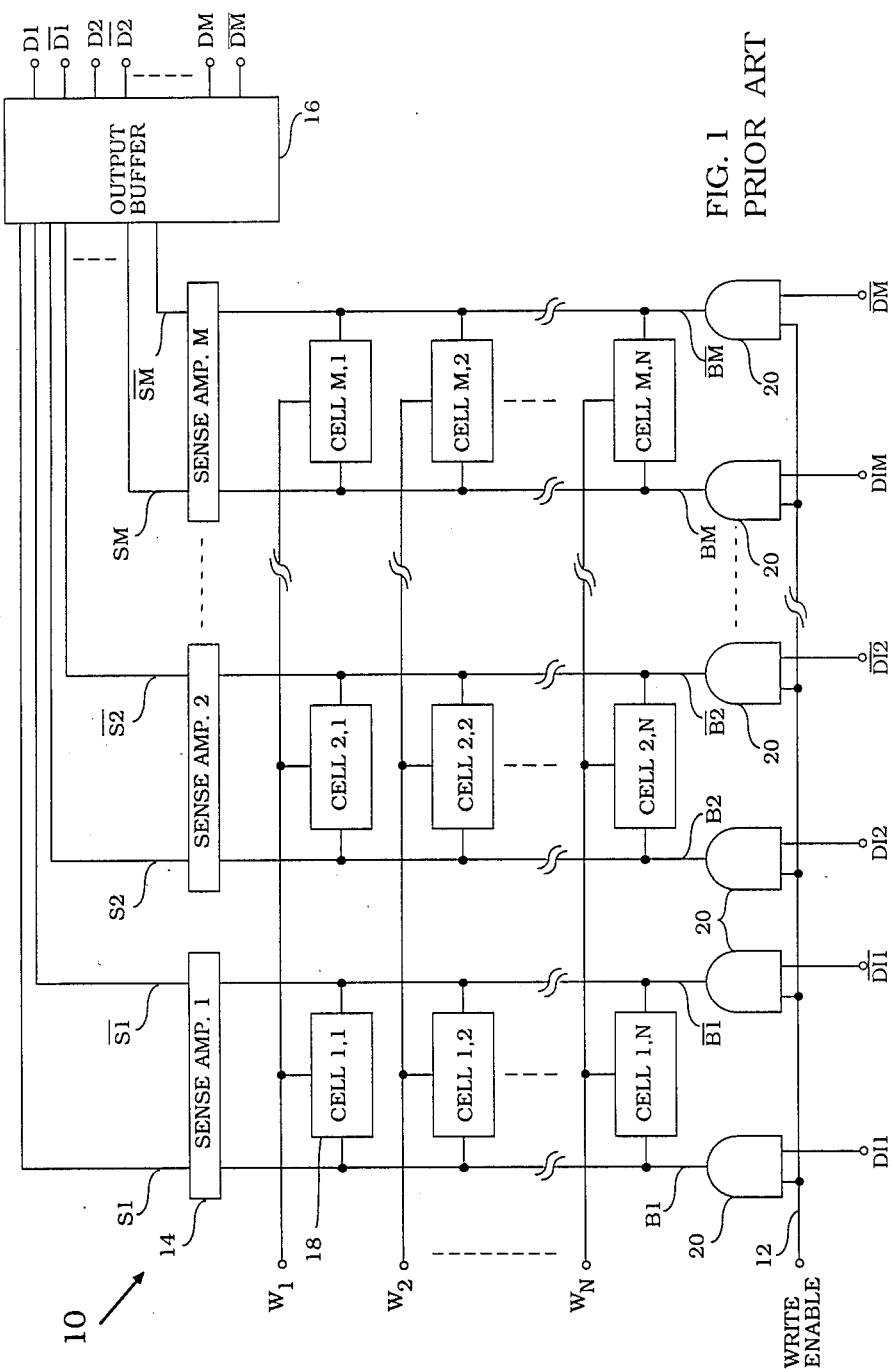
FIG. 1 is a block diagram of a conventional memory including an array of memory cells for storing and subsequent readout of data.

FIG. 1 illustrates a conventional random access memory for storing data in a selected memory cell or cells and for subsequent readout of the data. The memory is shown at 10 and includes a plurality of memory cells, 1,1 to M,N, which are arranged in an array of N rows and M columns. Each memory cell 18 is addressable via a plurality of word lines W1–WN. Using conventional memory addressing techniques, a selected word line W is energized to cause data to be coupled to a selected row of memory cells via data input lines DI1–DIM. These data input lines are coupled to the bit lines of memory 10, identified as B1–BM, via respective logic gates 20 which are controlled by a write enable control line 12.

When the write enable control line goes low, the signals on the data input lines are coupled to the bit lines and thereby to the row of cells selected by the given word line, as described above. During a read operation, the write enable line 12 goes high, which causes the output of gates 20 to float. The bit lines of the cells selected by a word line W are then coupled out to conventional sense amplifiers 14, shown as sense amps 1–M. The output lines of the sense amplifiers 14, lines S1–SN, are coupled to an output buffer 16 whose output lines are the memory 10 output data lines D1–DM. Note that in FIG. 1 the complement of the various data in and data out lines may also be used in a conventional random access memory cell. Further details of the operation of these lines are given below.

Broadly stated, the present invention is an apparatus for reducing the write recovery time of a memory as shown in FIG. 1. The present invention comprises means responsive to a write enable signal for decoupling the sense amplifiers from the output data lines D1–DM and for causing the data word being written into the memory to be coupled to the output data lines beginning at a time on or before when said write enable signal is removed, and means for overriding this sense amplifier decoupling means and said data state coupling means when the outputs of the sense amplifiers match the data state of the word that was stored in the selected memory word during the write cycle.

Figure 2:
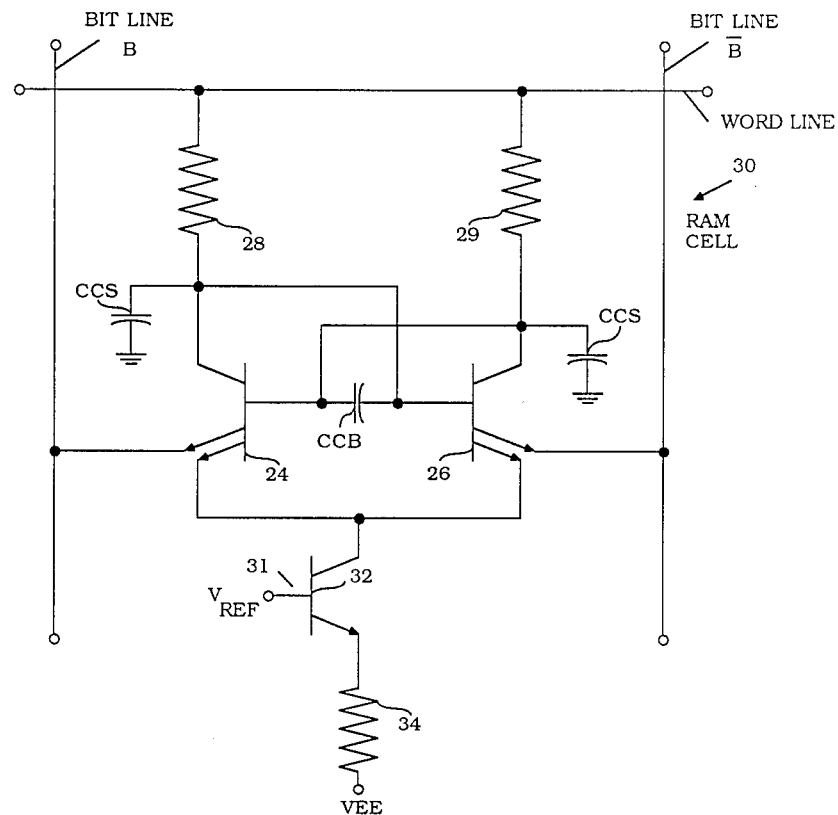
FIG. 2 is a circuit diagram of a conventional prior art random access memory cell.

A conventional prior art random access memory cell is illustrated at 30 in FIG. 2. This is an emitter coupled memory cell including first and second cross-coupled transistors 24 and 26. One emitter of transistor 24 is connected to bit line B. An emitter of the opposite transistor 26 is coupled to the complement of bit line B, shown as $\overline{B}$. Also illustrated are the bias resistors for each transistor, resistors 28 and 29, respectively, which are connected to the collectors of transistors 24 and 26. The word line for selecting this RAM cell 30 is shown connected to the side of resistors 28 and 29 which is opposite from the collectors of transistors 24 and 26. Finally, the second emitters of each transistor 24 and 26 are connected in common to a conventional current source 31. Current source 31 includes a transistor 32 whose base is coupled to a reference voltage $V_{REF}$ and whose emitter is coupled to a negative supply $V_{EE}$ via a resistor 34. Also shown in this cell are the parasitic capacitances for substrate capacitance, and $C_{cb}$, the collector to base capacitance. As mentioned previously, these parasitic capacitances $C_{cs}$ and $C_{cb}$ limit how fast transistors 24 and 26 can change state due to the time constants created by these capacitors in conjunction with resistors 28 and 29.

In operation, a given row of memory cells is selected by raising the voltage of a selected word line. Writing of the memory cell is performed by creating a differential bit line voltage on the bit line B and the bit line $\overline{B}$ associated with that cell such that the transistor with the lowest emitter voltage will be turned on. The cross-coupled aspect of this cell enables the turned on transistor to remain on once the the word line has gone low again. When the cell is selected for a read operation, the sense amplifier detects the memory cell state by detecting the presence of bit line current on the side of the memory cell which contains the on transistor.

Figures 3A, 3B:
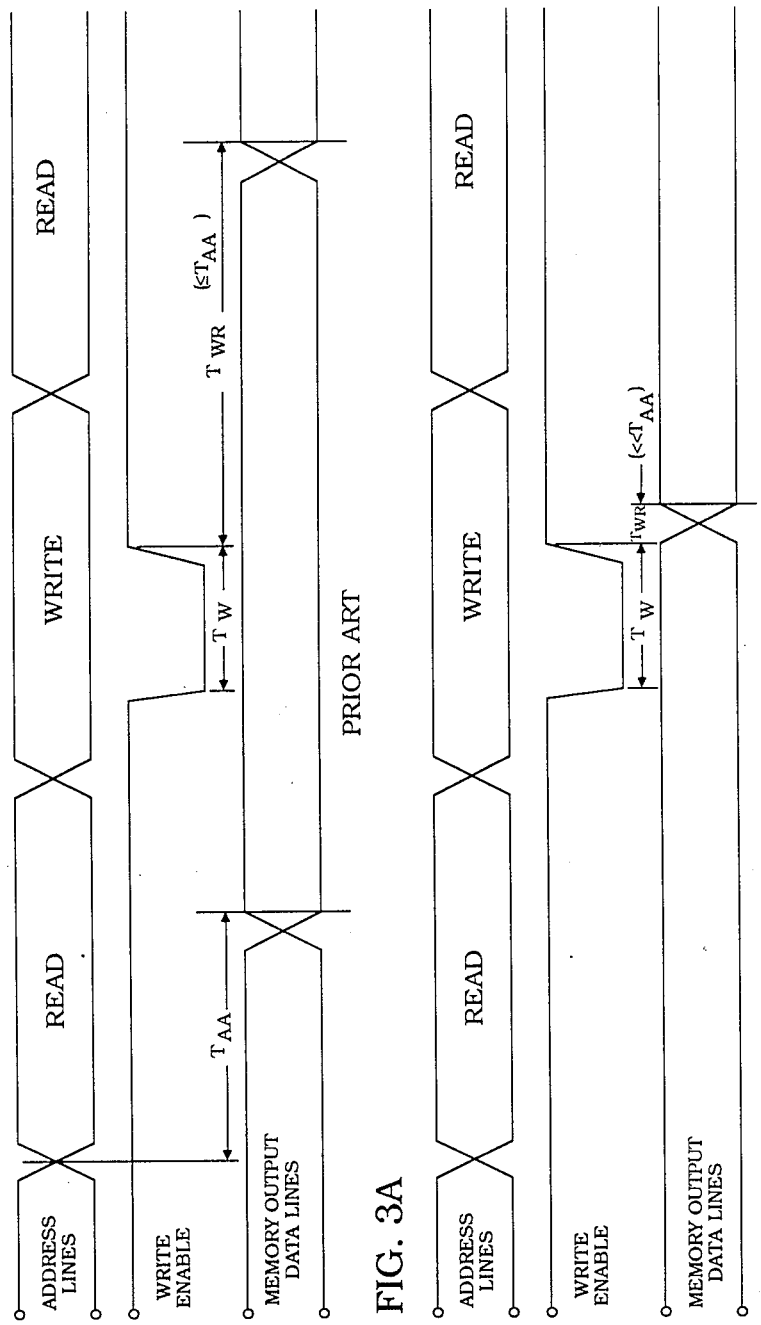
FIGS. 3A and 3B are timing diagrams illustrating the timing of data read and write operations according to the prior art memory illustrated in FIG. 1.

FIGS. 3A and 3B are timing diagrams illustrating the timing of data read and write operations according to the prior art memory illustrated in FIG. 1. Referring first to FIG. 3A, shown is a conventional read-write-read series of memory accessing operations. Initially, the address lines are set to a predetermined state for specifying a selected one of the memory words or memory cells in the memory. At some predetermined time after the address lines are in their correct state for accessing a particular memory word, the data word stored in the selected memory word will appear on the output data lines. This time interval is called the address access time (TAA) for the memory. Note that the write enable line remains high during a read operation. During a conventional write operation, after the address lines are set to identify the memory word in which data is to be written, the desired data is coupled to the memory data input lines, DI1–DIM. Thereafter, when the write enable line goes low, the data on these data input lines is caused to be stored in the selected memory word.

Note that the pulse on time for the write enable line is set by the memory user, and is referred to as the time TW. In this example, the earliest the user is going to do another read operation is in the next cycle time after the write cycle time. This subsequent read operation may address the same memory word for readout, but this is not necessary. Consequently, the write recovery time TWR need only be equal to or less than the address access time TAA for the subsequent read cycle. As mentioned previously, many users now find the address access time to be too slow for enabling access to memory data after a given write operation.

FIG. 3B illustrates the situation when a read operation is performed during the same cycle with a write operation. Referring now to FIG. 3B, during the write mode, the address lines and write enable line operate as described with reference to FIG. 3A. Once the write enable line goes high at the end of time TW, however, the user in this example wishes to have the data that was written into this memory word to be immediately read out on the output data lines of the memory. As can be seen, the write recovery time must be much much less than the address access time for this to be practical. The object of the present invention is to significantly reduce this write recovery time when such a read operation is desired during a write cycle immediately after a memory word write operation. As mentioned above, a write recovery time of five nanoseconds or less is desired between the time between when the write enable signal goes high and the selected data is available on the output data lines of the memory.

Figure 4:
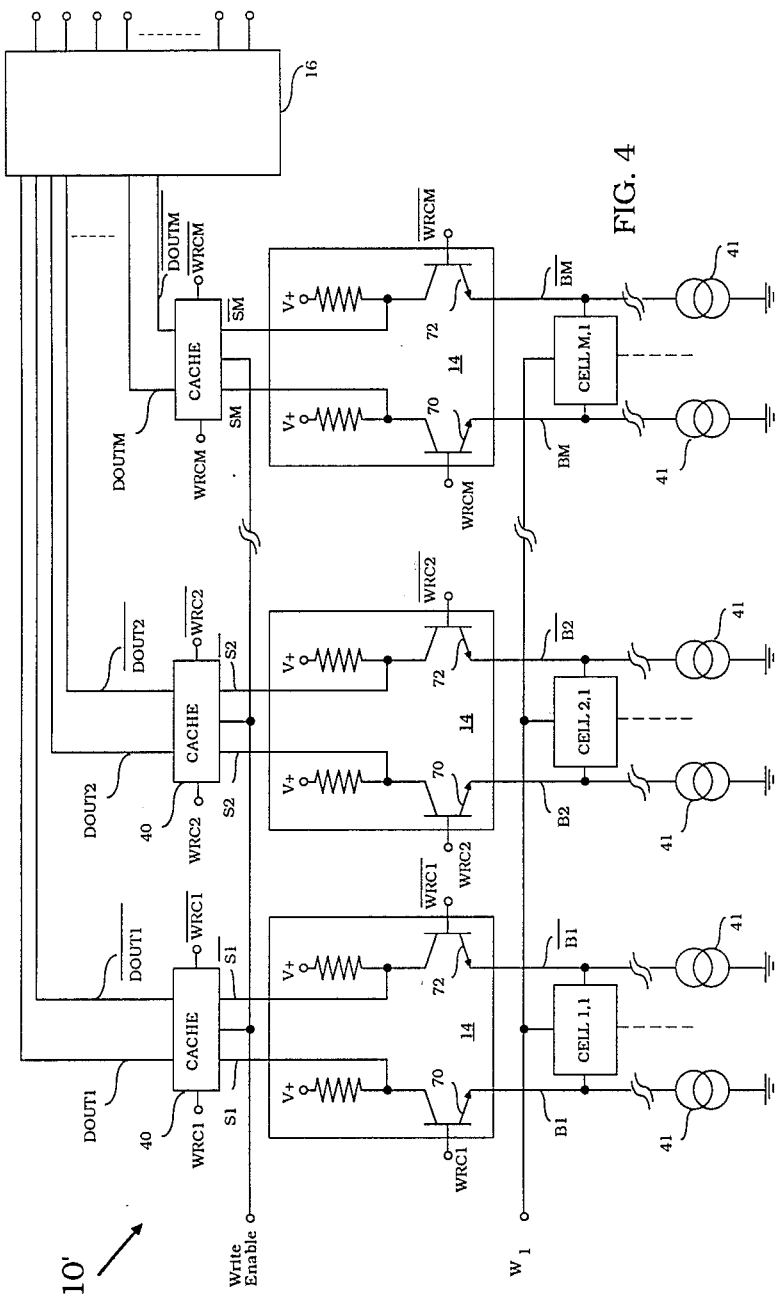
FIG. 4 is a partial block diagram of a memory including the apparatus of the present invention.

FIG. 4 is a partial block diagram of a memory 10' of the type as shown in FIG. 1 with the addition of the cache memory apparatus 40 of the present invention. As seen in FIG. 4, the output of each sense amplifier 14 is coupled to apparatus 40, which is interposed between the sense amplifier and the output buffer 16, and which functions according to the present invention to reduce the write recovery time of the memory 10'. Each of the sense amplifiers in memory 10 have a separate apparatus 40 attached thereto. Note also that additional control lines are coupled to both the apparatus' 40 and the sense amplifiers 14. These are the WRC and $\overline{\text{WRC}}$ control lines. During a write mode, these WRC signals are in one state when a 1 is being written into a memory cell and in a second state when a 0 is being written into a memory cell. Note that this arrangement is slightly different than in the memory of FIG. 1 in that the state of bit lines B1–BM in the memory shown in FIG. 4 are controlled via respective transistors, in each sense amplifier 14 and current sources 41 at the opposite ends of the bit lines.

During a read operation, all of the WRC lines are maintained at a neutral voltage bias to enable the state of the memory cells of the selected memory word to be sensed by their associated sense amplifiers 14. Amplifiers 14 differentially amplify these signals and feed them on lines S1-SM to the output buffer 16 via respective cache memory apparatus 40. During a write mode, however, complementary voltage signals are generated on the WRC and $\overline{WRC}$ control lines. The WRC1 and $\overline{WRC1}$ lines, for example, will cause the corresponding cell 1,1 along the memory column W1 to either stay in its original state, if the polarity of the complementary states of the WRC1 and $\overline{WRC1}$ lines are one way, or to change state if the cell is in the opposite state to the complementary states of the WRC1 and $\overline{WRC1}$ lines. Further details of the operation of this conventional cell operational feature are described below with respect to the timing diagram shown in FIG. 6.

The important thing to note in FIG. 4 is that each of the sense amplifier outputs S1-SM are fed to a respective apparatus 40 prior to being coupled out to output buffer 16. As described in greater detail with respect to FIG. 5, each apparatus 40 functions to decouple the output of its associated sense amplifier 14 from output buffer 16 during a write operation and to create a second data path means. That is, it independently couples the data word being written to the memory to the output date lines until the data word appears on the sense amplifier output lines S1-SM, at which time the apparatus 40 decoupling means is overridden.

Figure 5:
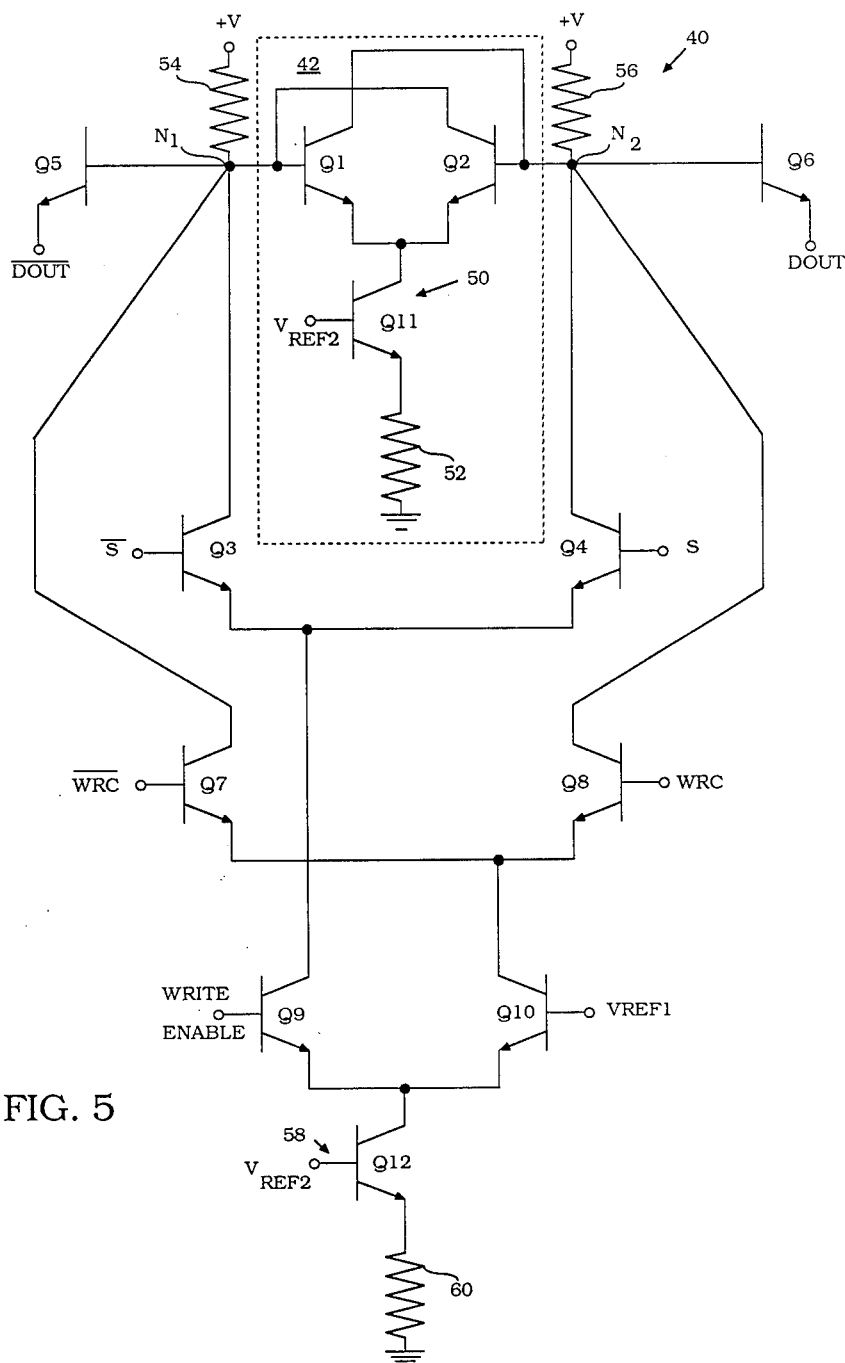
FIG. 5 is a circuit diagram of the apparatus according to the present invention.

FIG. 5 illustrates the circuit diagram of the apparatus 40 according to the present invention. Each apparatus 40 shown in FIG. 4 includes this circuit. Referring now to FIG. 5, the output sense lines S and $\overline{S}$ from an associated sense amplifier 14 are coupled to apparatus 40 at the base of transistors Q3 and Q4 respectively. The corresponding read/write control lines WRC and $\overline{WRC}$ are coupled to the bases of transistors Q8 and Q7 respectively. The write enable line is coupled to apparatus 40 at the base of transistor Q9. The complementary output data lines DOUT and $\overline{DOUT}$, which are coupled to the output buffer 16 from apparatus 40, are driven by the emitters of Q5 and Q6 respectively.

Apparatus 40 includes a cache memory element 42 including a conventional cross coupled two transistor flip-flop memory element comprising transistors Q1 and Q2. Transistors Q1 and Q2 are driven by a current source 50 comprising a transistor Q11 whose collector is tied to the emitter of each of the transistors Q1 and Q2. The amount of current generated by current source 50 is controlled by the voltage of a voltage reference $V_{REF2}$ coupled to the base of transistor Q11 and a resistor 52 coupled between the emitter of transistor Q11 and ground. The state of transistors Q1 and Q2 are controlled by the voltages existing on nodes N1 and N2, node N1 being connected to the base of transistor Q1 and the collector of transistor Q2 and node N2 being connected to the base of transistor Q2 and the collector of transistor Q1. Bias for cache memory element 42 is provided by two resistors 54 and 56 connected between voltage source +V and nodes N1 and N2 respectively.

Node N1 also controls the output $\overline{DOUT}$ through the emitter follower formed by transistor Q5. Similarly, output DOUT is controlled by the voltage on node N2 through the emitter follower formed by transistor Q6. Finally, the collectors of both transistors Q3 and Q7 are connected to node N1 and the collectors of both transistors Q4 and Q8 connected to node N2. Nodes N1 and N2 are biased such that if transistors Q3, Q4, Q7 and Q8 are off, the present state of cache memory element 42 is maintained by current source 50.

The current through transistors Q3 and Q4 is controlled by the state of transistor Q9, which is on when the write enable line is high. The current coupled through transistor Q9 when it is on, and thereby through either transistor Q3 or Q4, is controlled by current source 58. This is another conventional current source comprising a transistor 12 whose collector is connected to the emitter of transistor Q9, whose base is fed from a reference voltage $V_{REF2}$, and whose collector is coupled to ground via a resistor 60. Also connected to current source 58 is a transistor Q10 whose function will be described below. Note at this point that the voltage of the write enable signal needs to be higher than $V_{REF1}$, the voltage driving the base of Q10, in order to cause substantially all of the current from current source 58 to flow through Q9.

During a read operation, when data is being read out of memory 10', apparatus 40 operates in the following manner. The write enable line remains high, which keeps transistor Q9 turned on. With transistor Q9 on, current is allowed to flow through transistor Q9 and thus through whichever of transistors Q3 or Q4 is currently on. As mentioned above, Q3 and Q4 are driven by the output of the associated sense amplifier 14 lines S and $\overline{S}$. Depending on the state of the S and $\overline{S}$ lines, the inverse of these states then appears on the emitters of transistors Q5 and Q6, respectively, and thus are coupled out on the DOUT and $\overline{DOUT}$ lines. These data out lines are coupled to the output buffer 16 to be output as the output data lines of the memory 10'. Consequently, as can be seen, in this mode the data that is being read out from the memory 10' is output on the sense amplifier 14 S and $\overline{S}$ lines and passes straight through apparatus 40 to the output buffer 16. Thus, apparatus 40 is essentially transparent to such read mode operations.

During a write operation, when the write enable line goes low relative to the voltage $V_{REF1}$ input to transistor Q10, the current generated by current source 58 is coupled through transistor Q10 instead of transistor Q9. This enables transistors Q7 and Q8 to affect the voltage on nodes N1 and N2, rather than transistors Q3 and Q4. As described above, the state of transistors Q7 and Q8 depends on the state of the WRC and $\overline{WRC}$ lines, which are coupled to the bases of transistors Q7 and Q8. The WRC and $\overline{WRC}$ lines cause only one of the two transistors Q7 or Q8 to be on. Q7 is on if the data is one state and Q8 is on if the data is in its other state. As a result, the state of these WRC and $\overline{WRC}$ lines determines whether or not the voltage at node N1 is higher or lower than the voltage at node N2. Since the WRC and $\overline{WRC}$ lines reflect the state of the particular data bit being written into the selected memory cell along the bit column in which the apparatus 40 is located, this data state is caused to substantially immediately appear on nodes N1 and N2 as soon as the data state is reflected in the state of the WRC and $\overline{WRC}$ lines. This is in addition to the WRC and $\overline{WRC}$ lines being fed to the memory cell itself for writing of this data bit into that selected memory cell.

With this data state on nodes N1 and N2, two conditions exist. First, these data states are immediately output through emitter follower transistors Q5 and Q6 as the DOUT and $\overline{DOUT}$ lines. Secondly, the voltage difference on N1 and N2 causes the state of the cache memory element 42 to be set to correspond to the data state appearing at nodes N1 and N2. Note that a voltage is generated on only one of the nodes N1 or N2 because only one of the transistors Q7 or Q8 is on. With the data bit state now stored in the cache memory element 42, it is now available to independently drive transistors Q5 and Q6 and thus be coupled out to output buffer 16. This is necessary once the write enable line goes high at the end of the user defined write enable signal pulse interval TW, since the WRC and $\overline{WRC}$ lines no longer control the voltage at nodes N1 and N2 at this point.

As the write enable signal voltage rises above the voltage of $V_{REF1}$, the current from current source 58 again begins flowing through transistor Q9, thus enabling transistors Q3 and Q4 to again control the voltages on nodes N1 and N2, depending on the state of the sense amplifier output lines S and $\overline{S}$. According to the preferred embodiment of the present invention, the S and $\overline{S}$ lines initially remain at a low voltage when the write enable line goes high, thus maintaining transistors Q3 and Q4 off, until the S and $\overline{S}$ lines pull apart far enough in voltage to turn on either Q3 or Q4 and thereafter control the voltage on nodes N1 and N2 and thereby override the effect of cache memory element 42 on these nodes. In the interim, the cache memory element 42 independently acts to control the state of the DOUT and $\overline{DOUT}$ lines. An advantage of the present invention is that the cache memory element 42 can be designed to change state much faster than the conventional memory cells in memory 10' since only one such element 42 is required for each column of memory cells. That is, element 42 can therefore use more power without significantly adversely impacting overall system power usage.

Referring again to FIG. 4, it can be seen that the S and $\overline{S}$ lines initially both stay low until the memory cell connected to the respective sense amplifier has been completely written into. Each sense amplifier includes two transistors 70 and 72 whose bases are connected to the WRC and $\overline{WRC}$ lines, respectively. The collector of each transistor 70, 72 is coupled to the bit line B and $\overline{B}$, respectively of the associated column of the memory cells connected to that sense amplifier 14. The emitter of each transistor 70, 72 is coupled out as the sense amplifier 14 output lines S and $\overline{S}$. In operation, this circuit causes the S and S lines to remain at a low voltage that is insufficient to turn on transistors Q3 and Q4 in the apparatus 40 until the data being written into the selected cell in that column associated with the sense amplifier 14 has changed state sufficiently such that the collector voltage of one of the transistors 70 or 72 exceeds the read voltage level fo the WRC lines. The transistor 70 or 72 whose voltage exceeds this level is thereafter amplified and becomes sufficient to drive the base of its associated transistor Q3 or Q4.

Figure 6:
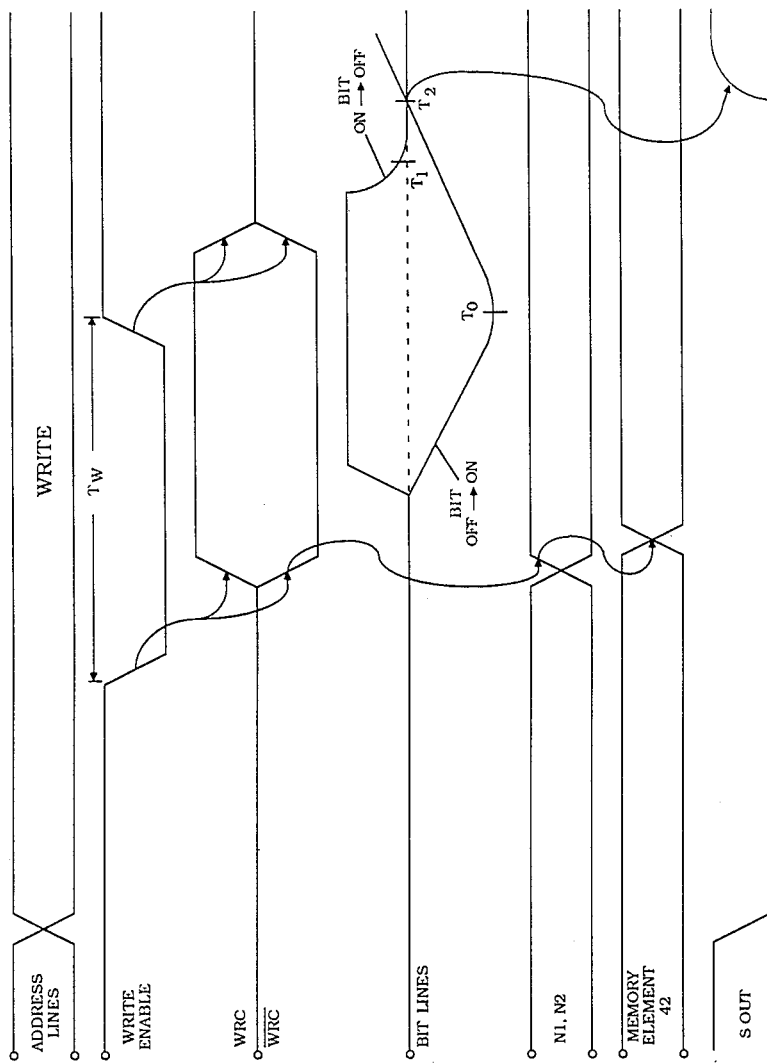
FIG. 6 is a timing diagram illustrating the operation of the apparatus as shown in FIGS. 4 and 5.

A timing diagram illustrating the operation of the apparatus as described above in FIGS. 4 and 5 is shown in FIG. 6. As can be seen in FIG. 6, during a write operation, the write enable line goes low a certain length of time after the address lines enter into the state desired for selecting a specific memory word. When the write enable line goes low, the WRC and $\overline{WRC}$ lines spread to complementary high and low states depending on whether or not a 1 or a 0 is being written into the specific memory cell to which these WRC lines are connected. Since the WRC lines are connected to the bases of transistors Q7 and Q8 in the corresponding apparatus 40 for the particular memory cell, the nodes N1, N2 immediately reflect the data state of the data bit being written into the memory cell as a function of the WRC and $\overline{WRC}$ lines. The data state reflected in nodes N1 and N2 is, as described above immediately coupled out via emitter follower transistors Q5 and Q6 as the DOUT and $\overline{DOUT}$ lines which are coupled to the output buffer 16. At some point in time after the WRC lines reflect the 1 and 0 data states being written into the cell, the cell begins to change state as a function of the voltage on the bit lines as shown. One of the bit lines goes high on the side of the memory cell which is to go from a transistor on to a transistor off state. The other and complementary bit line goes low and the transistor which is go from an off to an on state begins to change state at time T0.

Note that the cell is successfully written at time T0 but accurate data reflecting this state change is not available from the memory cell until after time T2, when the memory cell reaches a steady state condition. The rate of rise between time T0 and T2 is what is going to determine the period of time it takes for the cell to output correct data on the bit lines B and $\overline{B}$. A problem is that, between time T1 and T2, the bit lines are in a state that would tell the sense amplifier 14 the wrong data. The rise time of the memory cell between time T0 and T2 is controlled by memory cell time constants controlled by the cell resistors and parasitic capacitances, as described above. Only after time T2, when the bit lines are accurately showing the data state of the memory cell, does the sense amplifier 14 associated with the memory cell begin to output signals on its S and $\overline{S}$ lines reflective of this state. Without an apparatus 40 according to the present invention, one could not read the data from the memory cell until some time after time T2. With apparatus 40, the data being written into the memory cell is available on the output corresponding to the sense amplifier substantially before time T2 or even T0. In other words, the output states of the sense amplifier 14 are forced or preset into the state that will exist once the memory writing operation in the memory cell has been completed. At that point, the S and $\overline{S}$ lines separate far enough to override the operation of the memory element 42 and begin to dominate the voltage on nodes N1 and N2 and thereby the output data lines DOUT and $\overline{DOUT}$.

The invention has been described above with respect to one preferred embodiment. Other embodiments will be apparent to those of ordinary skill in the art. It is therefore not intended that this invention be limited except as indicated by the appended claims.

What is claimed is:

1. In a memory including an array of memory cells organized into a plurality of memory words, and including means responsive to a write enable signal for writing a data word appearing at memory input data lines to a selected memory word when said write enable signal is in a first state, and for coupling the data word stored in a selected memory word to memory output data lines when said write enable signal is in a second state, said means for coupling a data word stored in a selected memory word to said output data lines including sense amplifier means for amplifying said stored data word, an apparatus for reducing the write recovery time of said memory comprising:

means responsive to said write enable signal being in said first state for decoupling said data word coupling means from said output data lines;

second data path means for coupling said data word appearing at said input data lines to said output data lines beginning at a time at least by when said write enable signal changes from said first state to said second state; and means for overriding said second data path means when the output of said sense amplifier means matches the data state of the data word stored in said selected memory word.

2. The apparatus of claim 1 wherein said second data path means comprises:

cache memory means;

means for storing said data word in said cache memory means; and means for causing the data word stored in said cache memory means to be coupled to said output data lines when said write enable signal changes from said first state to said second state.

3. The apparatus of claim 2 wherein said cache memory means comprises a plurality of memory bits, each bit comprising first and second transistors; means for connecting said first and second transistors in a cross-coupled configuration; and biasing means for maximizing the switching speed of said first and second transistors.

4. The apparatus of claim 1 wherein said means for decoupling said data coupling means from said output data lines comprises transistor switch means responsive to said write enable signal being in said first state for decoupling the amplified stored data word output by said sense amplifier means from said output data lines.

5. The apparatus of claim 1 wherein said second data path means comprises:

cache memory means;

transistor switch means responsive to said write enable signal being in said first state for coupling said data word appearing at said memory input data lines to said output data lines and to said cache memory means, said cache memory means acting in response thereto to reflect the state of said data word; and means responsive to when said write enable signal changes state from said first state to said second state for coupling the data state of said cache memory means to said output data lines and for decoupling said transistor switch means.

6. The apparatus of claim 1 wherein said means for overriding said second data path means comprises means responsive to said write enable signal being in said second state for coupling the output of said sense amplifier means to said output data lines after said selected memory word has reached a steady state.

7. In a memory including an array of memory cells organized into a plurality of memory words, and including means for writing data appearing at memory input data lines to a selected memory word when a write enable signal is generated, and for reading out to memory output data lines the data stored in a selected memory word when said write enable signal is removed, said means for reading out data stored in a selected memory word to said output data lines including sense amplifier means for amplifying said stored data, an apparatus for reducing the write recovery time of said memory during a write operation comprising:

cache memory means, means responsive to the generation of said write enable signal for decoupling said data read out means from said output data lines, for storing in said cache memory means the data state of data being stored in a selected said memory word, and for coupling the data stored in said cache memory means to said output data lines beginning at a time at least by when said write enable signal is removed; and means responsive to the removal of said write enable signal for overriding said cache memory coupling means when the output of said sense amplifier means matches the data state of the data written into said selected memory word.

8. In a memory including an array of memory cells and a plurality of word and bit lines for selectively addressing each said cell for either writing a desired data state to a selected cell responsive to the existance of a write enable signal, said data state being coupled to said cell on its associated bit line, or for reading out the current data state stored by said selected cell responsive to the absense of said write enable signal, said data state appearing on the associated bit line of said cell, each bit line further including means for amplifying said data state during read out and for coupling the amplified data state to a corresponding output data line, an apparatus for reducing the write recovery time of a memory cell into which a selected data state is being written, comprising:

means responsive to the existance of said write enable signal for decoupling the bit line associated with the selected memory cell into which a data state is being written from said corresponding output data line;

cache memory means;

means responsive to the existance of said write enable signal for storing in said cache memory means the data state being written into said selected memory cell;

means for coupling said data state stored in said cache memory means to the data output line corresponding to said selected memory cell in response to the removal of said write enable signal; and means for overriding said data state coupling means when the memory cell into which said selected data state is being written reaches a steady state condition.

9. The apparatus of claim 8 wherein said means for decoupling the bit line associated with said selected memory cell comprises transistor switch means responsive to the existance of said write enable signal for decoupling the amplified data state output of said bit line amplifying means from said corresponding output data line.

10. The apparatus of claim 8 wherein said cache memory means comprises first and second transistors;

means for connecting said first and second transistors in a cross-coupled configuration such that a data state input to said first and second transistors is stored thereby; and means for biasing said first and second transistors to maximize their switching speed.

11. The apparatus of claim 8 wherein said means for storing the data state being written into said selected memory cell in said cache memory means comprises transistor switch means for coupling said data state being written to said memory cell to said cache memory means responsive to the existance of said write enable signal.

12. The apparatus of claim 8 wherein said means for overriding said data state coupling means comprises means responsive to the absence of said write enable signal for coupling the output of said sense amplifier means to said output data line after said corresponding selected memory cell has reached a steady state.

13. In a memory including an array of memory cells and a plurality of word and bit lines for selectively addressing each said cell for either writing a desired data state to a selected cell responsive to the existance of a write enable signal, said data state being coupled to said cell on its associated bit line, or for reading out the current data state stored by said selected cell responsive to the absense of said write enable signal, said data state appearing on the associated bit line of said cell, each bit line further including means for amplifying said data state during read out and for coupling the amplified data state to a corresponding output data line, a method for reducing the write recovery time of a memory cell into which a selected data state is being written, comprising the steps of:

detecting the existance of said write enable signal;

decoupling the bit line associated with the selected memory cell into which said data state is being written from said corresponding output data line in response to said detection of said write enable signal;

coupling said data state being written to said output data lines over a second data path;

storing said data state being written in a fast cache memory whose switching speed is fast with respect to said memory cell;

detecting the absense of said write enable signal;

coupling said data state stored in said cache memory means to said output data line corresponding to said selected memory cell in response to said detection of the absense of said write enable signal; and recoupling said bit line associated with said selected memory cell to said corresponding output data line when the memory cell into which selected data state is being written reaches a steady state condition.

* * * * *